United States Patent
Huang et al.

(10) Patent No.: US 11,925,048 B2
(45) Date of Patent: Mar. 5, 2024

(54) DISPLAY PANEL, METHOD FOR MANUFACTURING SAME, AND DISPLAY DEVICE

(71) Applicants: Hefei BOE Joint Technology Co., Ltd., Anhui (CN); BOE Technology Group Co., Ltd., Beijing (CN)

(72) Inventors: Wentong Huang, Beijing (CN); Rui Peng, Beijing (CN); Xiaoning Liu, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 227 days.

(21) Appl. No.: 17/489,641

(22) Filed: Sep. 29, 2021

(65) Prior Publication Data

US 2022/0165977 A1    May 26, 2022

(30) Foreign Application Priority Data

Nov. 24, 2020 (CN) .......................... 202011330859.0

(51) Int. Cl.
| | |
|---|---|
| *H10K 50/813* | (2023.01) |
| *H10K 71/00* | (2023.01) |
| *H10K 71/60* | (2023.01) |
| *H10K 102/00* | (2023.01) |
| *H10K 102/10* | (2023.01) |

(52) U.S. Cl.
CPC ........... *H10K 50/813* (2023.02); *H10K 71/00* (2023.02); *H10K 71/611* (2023.02); *H10K 2102/103* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 2003/0132434 A1 | 7/2003 | Hirano | |
| 2008/0303421 A1 | 12/2008 | Xu et al. | |
| 2017/0092707 A1* | 3/2017 | Wang | .................... H10K 59/123 |
| 2021/0217983 A1* | 7/2021 | Yu | ....................... H10K 59/1201 |

FOREIGN PATENT DOCUMENTS

| | | | |
|---|---|---|---|
| CN | 1456026 A | 11/2003 | |
| CN | 101278418 A | 10/2008 | |
| CN | 108470716 A | 8/2018 | |
| CN | 108511619 A * | 9/2018 | |
| JP | 2007242828 A | 9/2007 | |
| WO | 2011162080 A1 | 12/2011 | |
| WO | WO-2012046280 A1 * | 4/2012 | ......... H01L 27/3246 |

OTHER PUBLICATIONS

Work function of transparent conducting multicomponent oxide thin films prepared by magnetron sputtering.
CN2020113308590 first office action.

* cited by examiner

*Primary Examiner* — Michael Lebentritt
(74) *Attorney, Agent, or Firm* — IPro, PLLC

(57) ABSTRACT

Provided is a display panel. The display panel includes a substrate, an anode layer, a planarization layer and an organic functional layer. The anode layer is disposed on a side of the substrate, the planarization layer is disposed on a side of the anode layer away from the substrate and configured to cover the anode layer, and the organic functional layer is disposed on a side of the planarization layer away from the anode layer.

19 Claims, 4 Drawing Sheets

DISPLAY PANEL, METHOD FOR MANUFACTURING SAME, AND DISPLAY DEVICE

CROSS REFERENCE TO RELATED APPLICATION

This application claims priority to Chinese patent application No. 202011330859.0, filed on Nov. 24, 2020 and entitled "ORGANIC LIGHT-EMITTING DISPLAY PANEL, METHOD FOR MANUFACTURING SAME, AND DISPLAY DEVICE", the disclosure of which is incorporated in the present disclosure by reference in its entirety.

TECHNICAL FIELD

The present disclosure relates to the field of display technologies, and in particular relates to a display panel, a method for manufacturing the same and a display device.

BACKGROUND

An organic electroluminescent light-emitting diode, that is, an organic light-emitting diode (OLED) display panel has many advantages such as self-luminance, low driving voltage, high light-emitting efficiency, short response time, high definition and contrast, wide viewing angle, wide operating temperature range, flexible display and large-area full-color display. Thus, the OLED display panel is one of the most promising display panels.

Current OLED display panels are mainly made by a vacuum evaporation method and a solution method. Compared with the traditional vacuum evaporation method, the utilization ratio of materials can be greatly improved during the process of manufacturing the OLED display panel by the solution method, especially an ink-jet printing method. Thus, the cost can be reduced. In addition, advantages such as large-size display can be achieved, which is an important direction for the development of display technologies in the future.

SUMMARY

The present disclosure provides a display panel, a method for manufacturing the same and a display device. The technical solutions are described as follows.

In an aspect, a display panel is provided. The display panel includes: a substrate; an anode layer disposed on a side of the substrate; a planarization layer disposed on a side of the anode layer away from the substrate, the planarization layer being configured to cover the anode layer; and an organic functional layer disposed on a side of the planarization layer away from the anode layer.

Optionally, an absolute value of a difference between a second work function of a material of the planarization layer and a first work function of a material of the anode layer is less than a preset threshold.

Optionally, a hillock is provided on a surface of the anode layer away from the substrate, the planarization layer covering the hillock.

Optionally, a distance between a surface of the planarization layer away from the substrate and the surface of the anode layer away from the substrate is greater than a length of the hillock in a target direction, and the target direction being perpendicular to a bearing surface of the substrate.

Optionally, the display panel further includes a wrapping layer disposed between the anode layer and the planarization layer, wherein the wrapping layer is configured to wrap the surface of the anode layer away from the substrate.

Optionally, an absolute value of a difference between a third work function of a material of the wrapping layer and a first work function of a material of the anode layer is less than a preset threshold.

Optionally, the wrapping layer has a thickness of 10 nm to 20 nm.

Optionally, the wrapping layer has a thickness of 15 nm.

Optionally, the material of the wrapping layer is silver.

Optionally, a material of the anode layer is indium tin oxide (ITO) or indium zinc oxide (IZO).

Optionally, the organic functional layer at least includes a hole inject layer, a hole transport layer, a light-emitting layer, an electron transport layer and an electron inject layer.

In another aspect, a method for manufacturing a display panel is provided. The method includes: manufacturing an anode layer on a substrate; manufacturing a planarization layer on a surface of the anode layer away from the substrate, the planarization layer being configured to cover the anode layer; and manufacturing an organic functional layer on a surface of the planarization layer away from the anode layer.

Optionally, manufacturing the planarization layer on the surface of the anode layer away from the substrate includes: manufacturing the planarization layer by ink-jet printing a zinc oxide solution on the surface of the anode layer away from the substrate.

Optionally, prior to manufacturing the planarization layer on the surface of the anode layer away from the substrate, the method further includes: manufacturing a wrapping layer on a surface of the anode layer away from the substrate, wherein the wrapping layer wraps the surface of the anode layer away from the substrate; and manufacturing the planarization layer on the surface of the anode layer away from the substrate includes: manufacturing the planarization layer on a surface of the wrapping layer away from the substrate.

Optionally, after manufacturing the wrapping layer on the surface of the anode layer away from the substrate, the method further includes: performing ultraviolet ozone treatment on the surface of the wrapping layer away from the substrate.

Optionally, manufacturing the wrapping layer on the surface of the anode layer away from the substrate includes, forming the wrapping layer by forming a silver layer through vacuum thermal evaporation on the surface of the anode layer away from the substrate.

Optionally, an absolute value of a difference between a third work function of a material of the wrapping layer and a first work function of a material of the anode layer is less than a preset threshold.

Optionally, an absolute value of a difference between a second work function of a material of the planarization layer and a first work function of a material of the anode layer is less than a preset threshold.

Optionally, manufacturing the organic functional layer on the surface of the planarization layer away from the anode layer includes: sequentially manufacturing a hole inject layer, a hole transport layer, a light-emitting layer, an electron transport layer and an electron inject layer on the surface of the planarization layer away from the anode layer.

In yet another aspect, a display device is provided. The display device includes a power supply component and a display panel, the power supply component being configured to supply power to the display panel, wherein the display panel includes a substrate, an anode layer, a planarization layer and an organic functional layer, wherein the anode layer is disposed on a side of the substrate, the planarization layer is disposed on a side of the anode layer away from the substrate and configured to cover the anode layer, and the organic functional layer is disposed on a side of the planarization layer away from the anode layer.

BRIEF DESCRIPTION OF THE DRAWINGS

For clearer descriptions of the technical solutions in embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

In the related art, the OLED ink-jet printing technology is to drop an ink material highly precisely at positions, corresponding to pixels, on a substrate on which an anode and a pixel defining layer are manufactured in advance. However, during manufacture of the anode, hillocks are always formed on a surface of the anode if the thickness of the formed film of the anode is not uniform. These hillocks may easily cause a short circuit between the anode and a cathode, thereby forming a non-light-emitting area. As a result, dark spots are generated after the display panel is lit up, which seriously affects the display effect of the display panel.

Figure 1:
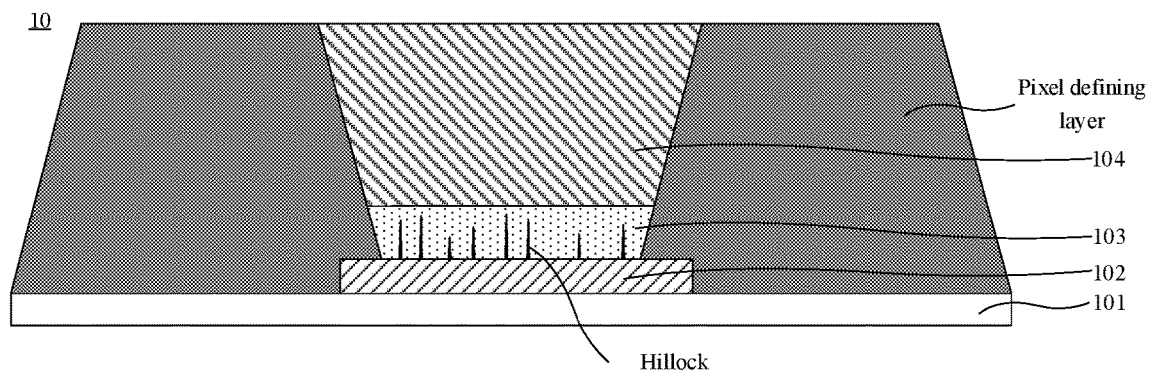
FIG. 1 is a schematic structural diagram of a display panel according to an embodiment of the present disclosure.

FIG. 1 is a schematic structural diagram of a display panel according to an embodiment of the present disclosure. Referring to FIG. 1, the display panel 10 may include a substrate 101, an anode layer 102, a planarization layer 103 and an organic functional layer 104. The anode layer 102 is disposed on a side of the substrate 101, the planarization layer 103 is disposed on a side of the anode layer 102 away from the substrate 101 and configured to cover the anode layer 102, and the organic functional layer 104 is disposed on a side of the planarization layer 103 away from the anode layer 102. That is, the anode layer 102, the planarization layer 103 and the organic functional layer 104 are sequentially stacked in a direction going away from the substrate 101.

Optionally, the display panel 10 provided by the embodiment of the present disclosure may be an OLED display panel.

In the embodiment of the present disclosure, the planarization layer 102 is disposed on the side of the anode layer 102 away from the substrate 101 to cover the anode layer 102, so that the display panel 10 can be prevented from black spots caused by a short circuit between the anode layer 102 and a cathode layer (not shown in the figure). Thus, the display effect of the display panel 10 is improved.

Referring to FIG. 1, hillocks will be formed on the surface of the anode layer 102 away from the substrate 101 if the thickness of the anode layer 102 is not uniform. In the embodiment of the present disclosure, since the planarization layer 103 of the display panel 10 covers the anode layer 102, the planarization layer 103 can also cover the hillocks on the surface of the anode layer 102. Therefore, a short circuit between the anode layer 102 and the cathode layer caused by the hillocks can be avoided, and the display effect of the display panel 10 can be guaranteed.

Certainly, the planarization layer 103 may also be disposed on the side of the anode layer 102 away from the substrate 101 if no hillock is formed on the surface of the anode layer 102 away from the substrate 101, which is not limited in the embodiments of the present disclosure.

In the embodiment of the present disclosure, the planarization layer 103 enables voltage of the anode layer 102 to be loaded to the organic functional layer 104, which ensures normal display of the display panel.

In summary, the embodiment of the present disclosure provides a display panel. In the display panel, the planarization layer is disposed on the side of the anode layer away from the substrate and covers the anode layer. Therefore, when hillocks are formed on the surface of the anode layer away from the substrate, the display panel can be prevented from black spots caused by a short circuit between the hillocks and the cathode layer, which improves the display effect of the display panel.

In the embodiment of the present disclosure, during manufacture of the anode layer 102, the hillocks are easily formed on the surface of the anode layer 102 if an anode material has poor film-forming uniformity. In the display panel 10 provided by the embodiment of the present disclosure, after the anode layer 102 is manufactured, the planarization layer 103 is manufactured on the surface of the anode layer 102 to cover the hillocks on the surface of the anode layer 102 away from the substrate 101. Therefore, the hillocks can be prevented from piercing the organic functional layer 104. Thus, a short circuit cannot be caused by connection between the anode layer 102 and the cathode layer is avoided, and the display panel 10 is prevented from black spots, thereby ensuring the display effect of the display panel 10.

In addition, since the planarization layer 103 has a certain thickness, it may be convenient for the planarization layer 103 to cover the hillocks on the surface of the anode layer 102, to prevent a short circuit between the anode layer 102 and the cathode layer. Meanwhile, since the planarization layer 103 is disposed on the side of the anode layer 102 away from the substrate 101, and the surface of the planarization layer 103 is more planar than that of the anode layer 102, it's ensured that the base on which the organic functional layer 104 is formed subsequently is planar, which is convenient for ink-jet printing of the organic functional layer 104.

In an exemplary embodiment, the distance between the surface of the planarization layer 103 away from the substrate 101 and the surface of the anode layer 102 away from the substrate 101 is greater than the length of the hillock in a target direction, and the target direction is perpendicular to a bearing surface of the substrate 101. Therefore, the hillocks can be prevented from piercing the planarization layer 103, and the planarization layer 103 can completely cover the hillocks on the surface of the anode layer 102, so as to prevent a short circuit between the anode layer 102 and the cathode layer.

In the embodiment of the present disclosure, the thickness of the planarization layer 103 may be generally determined based on the sizes of the hillocks on the surface of the anode layer 102, such that the planarization layer 103 can completely cover all the hillocks. If the hillocks are large in size (i.e., the height of the hillocks protruding from the surface of the anode layer is high), the planarization layer 103 needs to be thick enough to completely covers the hillocks. Certainly, the hillocks may penetrate through the planarization layer 103 to be in contact with the organic functional layer 104 if the planarization layer 103 fails to completely cover the hillocks, which may still cause a short circuit between the anode layer 102 and the cathode layer, thereby adversely affecting the display effect of the display panel 10.

In the embodiment of the present disclosure, it should be ensured that the hole transport effect is not adversely affected during the light-emitting process of the display panel when the material of the planarization layer 103 is selected. Thus, the planarization layer 103 needs to be made from a material with a work function similar to a work function of the material of the anode layer 102.

Optionally, the absolute value of the difference between a second work function of the material of the planarization layer 103 and a first work function of the material of the anode layer 102 is less than a preset threshold.

In an exemplary embodiment, when the anode layer 102 is made from indium tin oxide (ITO), its work function is about 4.7 electron volt (eV). Assuming that the preset threshold may be set to 0.5 eV, a material with a work function of about 4.2 eV to 5.2 eV may be adopted to manufacture the planarization layer 103.

Optionally, in the embodiment of the present disclosure, the planarization layer is made from zinc oxide (ZnO) with a work function of about 5 eV. During manufacture of the planarization layer 103, a ZnO solution may be sprayed onto the surface of the anode layer 102 by ink-jet printing, and a ZnO layer is formed after the ZnO solution dries.

It should be understood that in practice, the preset threshold may be adjusted according to actual conditions, and the materials of the anode layer 102 and the planarization layer 103 may also be changed according to actual requirements, which are not limited in the embodiments.

In the embodiment of the present disclosure, since the planarization layer 103 is formed by solution spraying, a film layer of the planarization layer 103 will sink rapidly after being formed, which will easily cause the hillocks on the surface of the anode layer 102 to pierce the planarization layer 103. Therefore, referring to FIG. 2, the display panel 10 may further include a wrapping layer 105 between the anode layer 102 and the planarization layer 103. The wrapping layer 105 may be configured to wrap the surface of the anode layer 102 away from the substrate (for example, the hillocks on the surface of the anode layer 102 may be wrapped), so as to prevent the hillocks on the surface of the anode layer 102 from piercing the planarization layer 103.

Optionally, the wrapping layer 105 also needs to be made from a material with a work function similar to that of the anode layer 102. That is, the absolute value of the difference between a third work function of the material of the wrapping layer 105 and the first work function of the material of the anode layer 102 also needs to be less than the preset threshold.

In an exemplary embodiment, metallic silver (Ag) with a work function of about 4.26 eV is preferably adopted as a material for manufacturing the wrapping layer 105. Owing to excellent ductility of silver, it is easier to wrap the hillocks. In order to guarantee the effect of wrapping the hillocks without causing the total thickness of the layer structure of the display panel 10 to be excessively large, the thickness of the wrapping layer 105 may range from 10 nm to 20 nm. For example, a favorable wrapping effect may be achieved by evaporating silver with a thickness of 15 nm, i.e., the thickness of the wrapping layer 105 is 15 nm.

In the embodiment of the present disclosure, the anode layer 102 may be made from ITO or IZO. Compared with ITO, IZO has better surface smoothness, low-temperature film-forming property and thermal stability. When the anode layer 102 is made from IZO, by taking advantage of the better surface smoothness of an IZO film, the abnormality of film layers of a device formed by ink-jet printing may be improved to reduce the hillocks, such that the probability of a short circuit between the anode layer 102 and the cathode layer may be lowered to a certain extent and the display effect of the display panel 10 may be improved.

Figure 3:
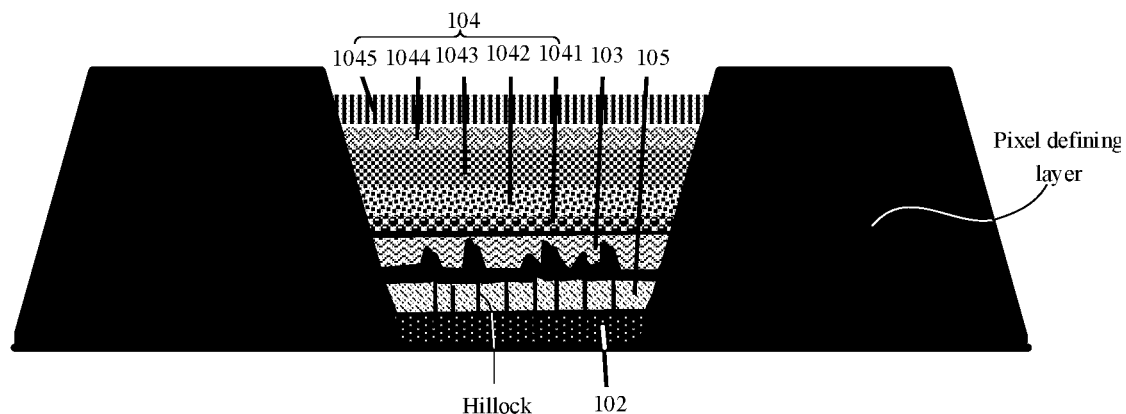
FIG. 3 is a schematic structural diagram of yet another display panel according to an embodiment of the present disclosure.

FIG. 3 is a schematic structural diagram of another display panel according to an embodiment of the present disclosure. Referring to FIG. 3, the organic functional layer 104 of the display panel 10 at least includes a hole inject layer (HIL) 1041, a hole transport layer (HTL) 1042, a light-emitting layer (EML) 1043, an electron transport layer (ETL) 1044 and an electron inject layer (EIL) 1045. In addition, a cathode layer and other functional layers of the display panel may be further disposed on the side of the organic functional layer away from the substrate, which is not repeated in detail in the embodiments. Here, the substrate 101 is not shown in FIG. 3.

Figure 2:
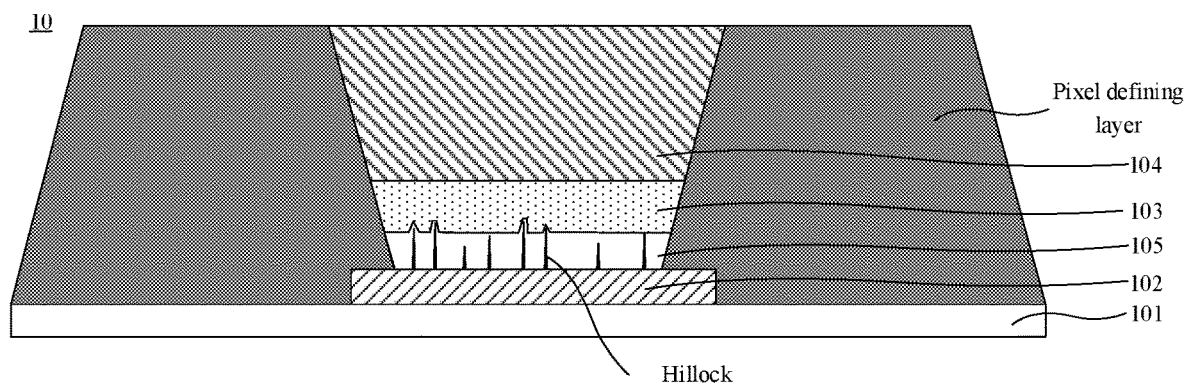
FIG. 2 is a schematic structural diagram of another display panel according to an embodiment of the present disclosure.

Referring to FIGS. 1 to 3, the display panel 10 may further include a pixel defining layer, which may be manufactured after the anode layer 102 is manufactured. The pixel defining layer may have an ink bank, which may also be referred to as a hollowed-out area. The ink bank may be configured to expose at least part of the anode layer 102, that is, part of the anode layer 103 may not be covered by the pixel defining layer.

The part of the anode layer 102 exposed from the ink bank may be a light-emitting area. The planarization layer 103 is configured to cover the anode layer 102, which may mean that the planarization layer 103 is configured to cover the part of the anode layer 102 which is not covered by the pixel defining layer, that is, the planarization layer 103 is configured to cover the light-emitting area.

In summary, the embodiment of the present disclosure provides a display panel. In the display panel, the planarization layer is disposed on the side of the anode layer away from the substrate and covers the anode layer. Therefore, the display panel can be prevented from black spots caused by a short circuit between the anode layer and the cathode layer, which can improve the display effect of the display panel.

Figure 4:
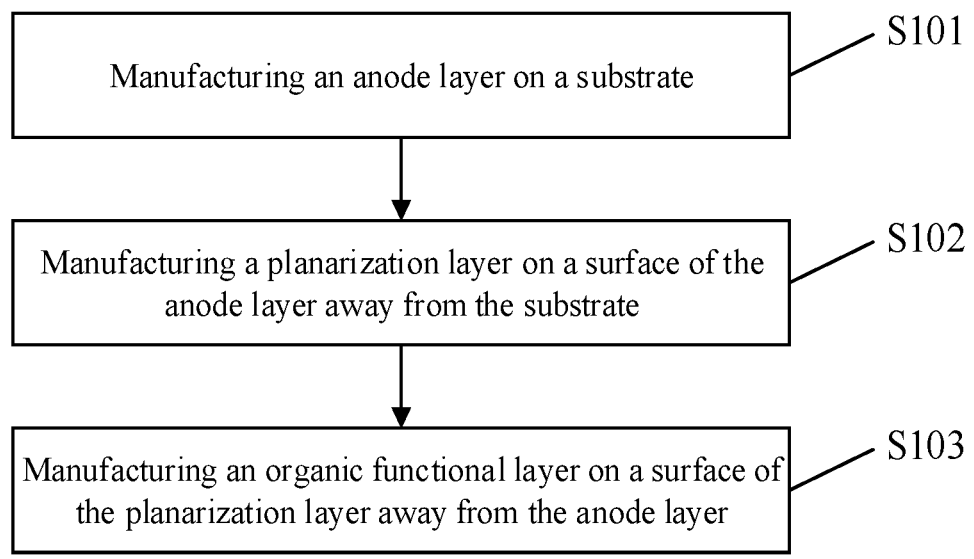
FIG. 4 is a flowchart of a method for manufacturing a display panel according to an embodiment of the present disclosure.

FIG. 4 is a flowchart of a method for manufacturing a display panel according to an embodiment of the present disclosure. The method may include the following steps.

In S101, an anode layer is manufactured on a substrate.

In S102, a planarization layer is manufactured on a surface of the anode layer away from the substrate.

The planarization layer may cover the anode layer.

In S103, an organic functional layer is manufactured on a surface of the planarization layer away from the anode layer.

In the embodiment of the present disclosure, the planarization layer is disposed on the side of the anode layer away from the substrate, such that the planarization layer covers the anode layer, which can prevent the display panel from black spots caused by a short circuit between the anode layer and a cathode layer. Thus, the display effect of the display panel is improved.

Hillocks may be formed on the surface of the anode layer away from the substrate if the thickness of the anode layer is not uniform. In the embodiment of the present disclosure, since the planarization layer in the manufactured display panel covers the anode layer, the planarization layer may also cover the hillocks on the surface of the anode layer. Therefore, a short circuit between the anode layer and the cathode layer caused by the hillocks can be avoided, and the display effect of the display panel can be guaranteed.

In summary, a method for manufacturing the display panel is provided by the embodiment of the present disclosure. In the display panel manufactured by this method, the planarization layer is disposed on the side, away from the substrate, of the anode layer and the planarization layer covers the anode layer. Therefore, the display panel can be prevented from black spots caused by a short circuit between the anode layer and the cathode layer, and the display effect of the display panel is improved.

Figure 5:
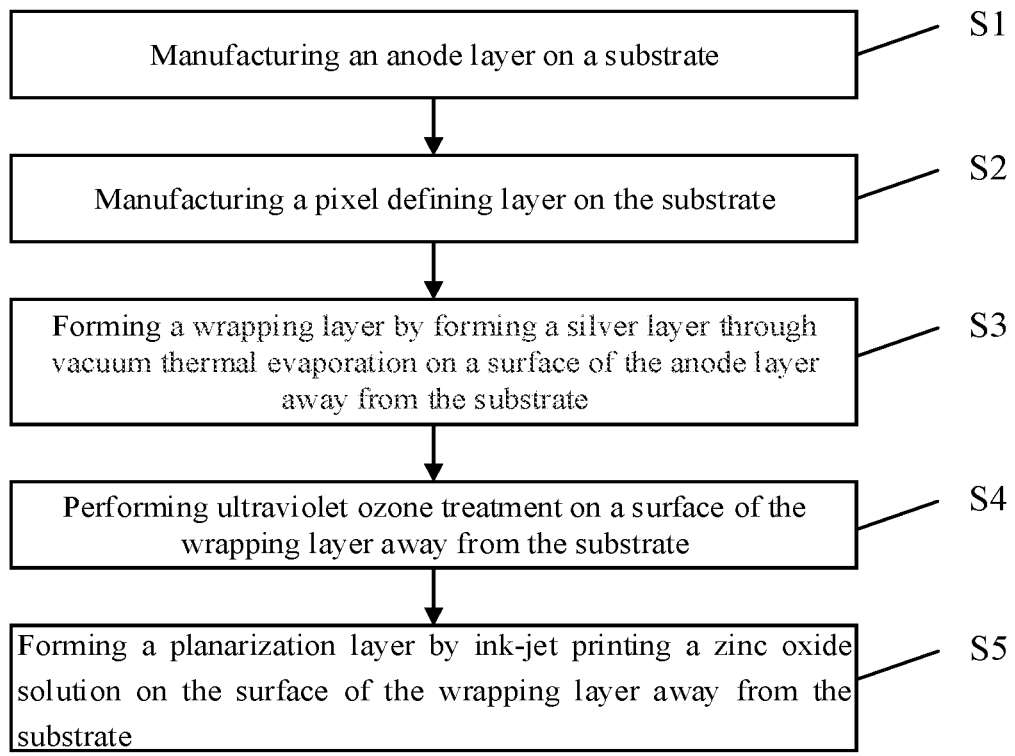
FIG. 5 is a flowchart of another method for manufacturing a display panel according to an embodiment of the present disclosure.

FIG. 5 is a flowchart of another method for manufacturing a display panel according to an embodiment of the present disclosure. Referring to FIG. 5, the method may include the following steps.

In S1, an anode layer is manufactured on a substrate.

The anode layer may be made from ITO or IZO. Compared with ITO, IZO has better surface smoothness, low-temperature film-forming property and thermal stability. When the anode layer is made from IZO, by taking advantage of the better surface smoothness of an IZO film, the abnormality of film layers of a device formed by ink-jet printing may be improved to reduce the hillocks, such that the probability of a short circuit between the anode layer and the cathode layer can be lowered to a certain extent and the display effect of the display panel can be improved.

In S2, a pixel defining layer is manufactured on the substrate.

After the pixel defining layer is manufactured, a plurality of ink banks will be formed in the pixel defining layer. The ink banks may also be referred to as hollowed-out areas. The ink banks may be configured to expose at least part of the anode layer. In the subsequent manufacture process, to-be-printed ink of all layers of the display panel is deposited on the anode layer exposed by the ink banks and then dried layer by layer, and finally the device is formed.

In S3, a wrapping layer is formed by forming a silver layer through vacuum thermal evaporation on a surface of the anode layer away from the substrate.

Figure 6:
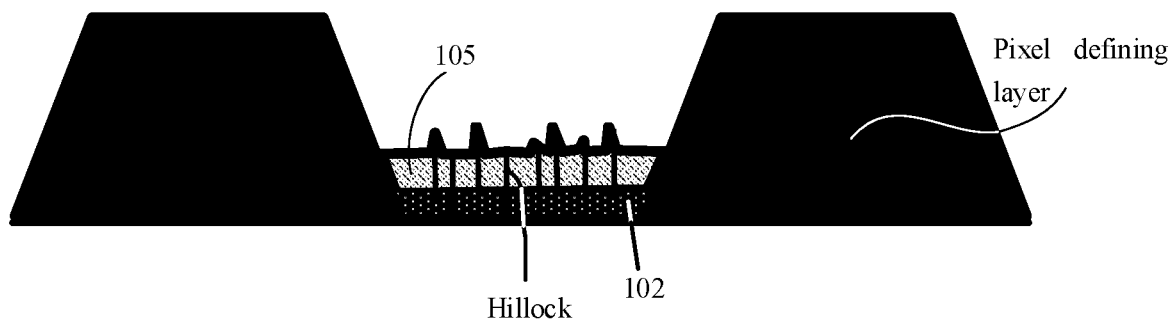
FIG. 6 is a schematic diagram of formation of a wrapping layer according to an embodiment of the present disclosure.

As shown in FIG. 6, the hillocks formed on the surface of the wrapping layer are wrapped hillocks.

In S4, ultraviolet ozone treatment is performed on a surface of the wrapping layer away from the substrate.

When the wrapping layer is made from silver and the planarization layer is made from zinc oxide, there is a certain different between the work functions of the materials of the two layers, which may lead to a hole transport barrier. Therefore, after the wrapping layer is manufactured, the surface of silver may be processed with UV-ozone to form a thin layer of silver oxide ($Ag_2O$) on the surface of silver. Silver oxide has a work function of 4.8 eV to 5.1 eV, which is approximate to that of zinc oxide. Therefore, the hole inject effect is better.

In S5, a planarization layer is formed by ink-jet printing a zinc oxide solution on the surface of the wrapping layer away from the substrate.

Figure 7:
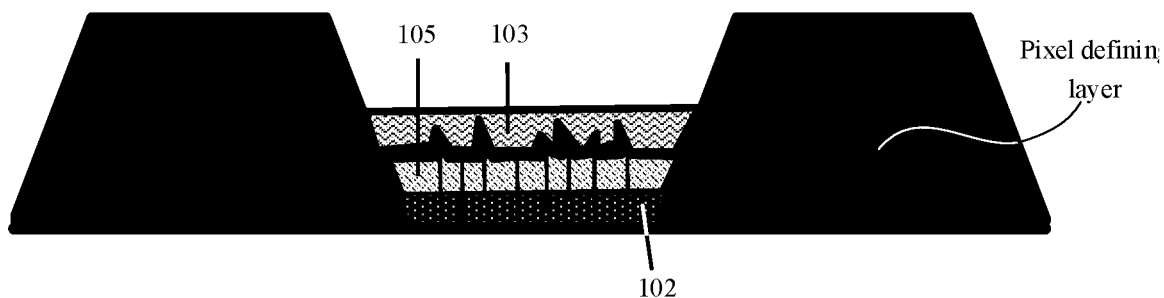
FIG. 7 is a schematic diagram of formation of a planarization layer according to an embodiment of the present disclosure.

In the embodiment of the present disclosure, during manufacture of the anode layer, hillocks may be easily formed on the surface of the anode layer if the anode material has poor film-forming uniformity. As shown in FIG. 7, in the embodiment of the present disclosure, a planarization layer may be manufactured to cover the hillocks on the surface of the anode layer away from the substrate. Therefore, a short circuit caused by connection between the anode layer and the cathode layer due to the hillocks can be avoided, and the display panel can be prevented from black spots. Therefore, the display effect of the display panel can be guaranteed.

In addition, since the planarization layer has a certain thickness, the planarization layer may conveniently cover the hillocks on the surface of the anode layer, to prevent a short circuit between the anode layer and the cathode layer. Meanwhile, since the planarization layer is disposed on the side of the anode layer away from the substrate, and the surface of the planarization layer is more planar than that of the anode layer, it's ensured that the base on which the organic functional layer is formed subsequently is planar, which is convenient for ink-jet printing of the organic functional layer.

In addition, when the display panel is manufactured by the method provided in this embodiment, since the thickness of film layers of the display panel may be increased due to the manufacture of the planarization layer, the overall thickness of the display panel may be kept unchanged by correspondingly reduce the thickness of the organic functional layer.

In S6, an organic functional layer is manufactured on a surface of the planarization layer away from the anode layer.

Optionally, the organic functional layer at least includes a hole inject layer (HIL), a hole transport layer (HTL), a light-emitting layer (EML), an electron transport layer (ETL) and an electron inject layer (EIL). Moreover, a cathode layer and other functional layers of the display panel may be further disposed on the side of the organic functional layer away from the substrate, which is not repeated in detail in the embodiments. The cathode layer may be made from Mg and Ag.

It should be understood that in the embodiments of the present disclosure, the anode layer, the pixel defining layer, the organic functional layer or other functional layers of the display panel may be directly manufactured by using technological processes in the prior art, which is not repeated herein in detail.

In summary, the method for manufacturing the display panel is provided by the embodiment of the present disclosure. In the display panel manufactured by the method, the planarization layer is disposed on the side, away from the substrate, of the anode layer and the planarization layer covers the anode layer. Therefore, the display panel can be prevented from black spots caused by a short circuit between the anode layer and the cathode layer, which can improve the display effect of the display panel.

Figure 8:
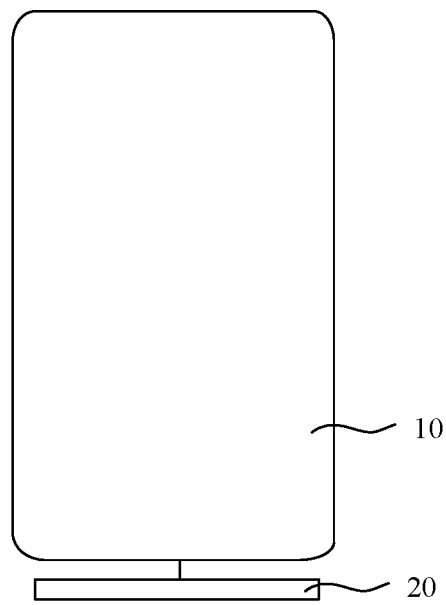
FIG. 8 is a schematic structural diagram of a display device according to an embodiment of the present disclosure.

FIG. 8 is a schematic structural diagram of a display device according to an embodiment of the present disclosure. Referring to FIG. 8, the display device may include a power supply component 20 and a display panel. The power supply component may be connected to the display panel and configured to supply power to the display panel. The display panel may be the display panel 10 provided in the above embodiments.

Since the planarization layer in the display panel may cover an anode layer, a short circuit between the anode layer and the cathode layer can be avoided, and the probability of black spots on the display panel can be lowered. Thus, the display effect of the display device can be optimized.

Optionally, the display panel may further include other structures which support or protect the display panel, such as a back plate, a frame and a housing. The display device may be used as a display terminal of various electronic devices such as a smart phone, a smart TV and a computer terminal.

In the embodiments of the present disclosure, the display device may be any product or component having a display function, such as a liquid crystal display panel, electronic paper, an OLED panel, a quantum dot light-emitting diode (QLED) panel, an active-matrix organic light-emitting diode (AMOLED) panel, a mobile phone, a tablet computer, a television, a display, a laptop computer, a digital photo frame or a navigator.

Described above are merely exemplary embodiments of the present disclosure, and are not intended to limit the present disclosure. Various modifications or equivalent substitutions that may be made by those skilled in the art within the essence and the protection scope of the present disclosure should fall within the protection scope of the present disclosure.

What is claimed is:

1. A display panel, comprising:
    a substrate;
    an anode layer disposed on a side of the substrate;
    a planarization layer disposed on a side of the anode layer away from the substrate, the planarization layer being configured to cover the anode layer;
    a wrapping layer disposed between the anode layer and the planarization layer, wherein the wrapping layer is configured to wrap the surface of the anode layer away from the substrate; and
    an organic functional layer disposed on a side of the planarization layer away from the anode layer.

2. The display panel according to claim 1, wherein an absolute value of a difference between a second work function of a material of the planarization layer and a first work function of a material of the anode layer is less than a preset threshold.

3. The display panel according to claim 1, wherein a hillock is provided on a surface of the anode layer away from the substrate, the planarization layer covering the hillock.

4. The display panel according to claim 3, wherein a distance between a surface of the planarization layer away from the substrate and the surface of the anode layer away from the substrate is greater than a length of the hillock in a target direction, the target direction being perpendicular to a bearing surface of the substrate.

5. The display panel according to claim 1, wherein an absolute value of a difference between a third work function of a material of the wrapping layer and a first work function of a material of the anode layer is less than a preset threshold.

6. The display panel according to claim 1, wherein the wrapping layer has a thickness of 10 nm to 20 nm.

7. The display panel according to claim 6, wherein the wrapping layer has a thickness of 15 nm.

8. The display panel according to claim 1, wherein the material of the wrapping layer is silver.

9. The display panel according to claim 1, wherein a material of the anode layer is indium tin oxide (ITO) or indium zinc oxide (IZO).

10. The display panel according to claim 1, wherein the organic functional layer at least comprises a hole inject layer, a hole transport layer, a light-emitting layer, an electron transport layer and an electron inject layer.

11. A method for manufacturing a display panel, comprising:
    manufacturing an anode layer on a substrate;
    manufacturing a wrapping layer on the surface of the anode layer away from the substrate, wherein the wrapping layer wraps the surface of the anode layer away from the substrate;
    manufacturing a planarization layer on a surface of the anode layer away from the substrate, the planarization layer being configured to cover the anode layer; and
    manufacturing an organic functional layer on a surface of the planarization layer away from the anode layer.

12. The method according to claim 11, wherein manufacturing the planarization layer on the surface of the anode layer away from the substrate comprises:
    manufacturing the planarization layer by ink-jet printing a zinc oxide solution on the surface of the anode layer away from the substrate.

13. The method according to claim 11, wherein:
    manufacturing the planarization layer on the surface of the anode layer away from the substrate comprises:
        manufacturing the planarization layer on a surface of the wrapping layer away from the substrate.

14. The method according to claim 11, wherein after manufacturing the wrapping layer on the surface of the anode layer away from the substrate, the method further comprises:
    performing ultraviolet ozone treatment on the surface of the wrapping layer away from the substrate.

15. The method according to claim 11, wherein manufacturing the wrapping layer on the surface of the anode layer away from the substrate comprises:
    forming the wrapping layer by forming a silver layer through vacuum thermal evaporation on the surface of the anode layer away from the substrate.

16. The method according to claim 11, wherein an absolute value of a difference between a third work function of a material of the wrapping layer and a first work function of a material of the anode layer is less than a preset threshold.

17. The method according to claim 11, wherein an absolute value of a difference between a second work function of a material of the planarization layer and a first work function of a material of the anode layer is less than a preset threshold.

18. The method according to claim 11, wherein manufacturing the organic functional layer on the surface of the planarization layer away from the anode layer comprises:
    sequentially manufacturing a hole inject layer, a hole transport layer, a light-emitting layer, an electron transport layer and an electron inject layer on the surface of the planarization layer away from the anode layer.

19. A display device, comprising a power supply component and a display panel, the power supply component being configured to supply power to the display panel, wherein
the display panel comprises a substrate, an anode layer, a planarization layer, a wrapping layer, and an organic functional layer, wherein the anode layer is disposed on a side of the substrate, the planarization layer is disposed on a side of the anode layer away from the substrate and configured to cover the anode layer, the wrapping layer is disposed between the anode layer and the planarization layer and is configured to wrap the surface of the anode layer away from the substrate, and the organic functional layer is disposed on a side of the planarization layer away from the anode layer.

\* \* \* \* \*